United States Patent
Zoellin et al.

(10) Patent No.: US 9,162,873 B2
(45) Date of Patent: Oct. 20, 2015

(54) COMPONENT AND METHOD FOR PRODUCING SAME

(71) Applicants: Jochen Zoellin, Muellheim (DE); Ricardo Ehrenpfordt, Korntal-Muenchingen (DE); Christoph Schelling, Stuttgart (DE); Juergen Graf, Stuttgart (DE); Frederik Ante, Stuttgart (DE); Michael Curcic, Stuttgart (DE)

(72) Inventors: Jochen Zoellin, Muellheim (DE); Ricardo Ehrenpfordt, Korntal-Muenchingen (DE); Christoph Schelling, Stuttgart (DE); Juergen Graf, Stuttgart (DE); Frederik Ante, Stuttgart (DE); Michael Curcic, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/074,877

(22) Filed: Nov. 8, 2013

(65) Prior Publication Data

US 2014/0124879 A1 May 8, 2014

(30) Foreign Application Priority Data

Nov. 8, 2012 (DE) .......................... 10 2012 220 323

(51) Int. Cl.
| | |
|---|---|
| *B81B 7/00* | (2006.01) |
| *B81B 3/00* | (2006.01) |
| *H01L 41/053* | (2006.01) |
| *H01L 41/31* | (2013.01) |
| *H04R 19/04* | (2006.01) |
| *H04R 7/04* | (2006.01) |
| *B81C 1/00* | (2006.01) |

(52) U.S. Cl.
CPC . *B81B 7/007* (2013.01); *B81B 3/00* (2013.01); *B81B 3/0021* (2013.01); *B81B 3/0027* (2013.01); *B81B 3/0032* (2013.01); *B81B 7/0032* (2013.01); *B81B 7/0058* (2013.01); *B81B 7/0061* (2013.01); *B81C 1/00158* (2013.01); *H01L 41/053* (2013.01); *H01L 41/0533* (2013.01); *H01L 41/31* (2013.01); *H04R 7/04* (2013.01); *H04R 7/045* (2013.01); *H04R 19/04* (2013.01); *B81B 2201/0257* (2013.01); *B81B 2207/092* (2013.01); *B81B 2207/096* (2013.01)

(58) Field of Classification Search
CPC . H01L 41/0533; H01L 41/053; H01L 41/047; H01L 41/0472; H01L 41/0475; H01L 41/31; H04R 7/04; H04R 7/045; H04R 19/04; B81B 3/0027; B81B 3/00; B81B 3/0032; B81B 7/0032; B81B 7/0058; B81B 7/00
See application file for complete search history.

(56) References Cited

U.S. PATENT DOCUMENTS

| 8,295,515 B2 * | 10/2012 | Kuratani et al. ............... 381/175 |
| 2007/0284714 A1 * | 12/2007 | Sakakibara et al. .......... 257/680 |
| 2008/0029852 A1 * | 2/2008 | Murayama et al. ........... 257/621 |

FOREIGN PATENT DOCUMENTS

DE 10 2010 040370 3/2012

*Primary Examiner* — Eduardo A Rodela
(74) *Attorney, Agent, or Firm* — Kenyon & Kenyon LLP

(57) ABSTRACT

A packaging concept for MEMS components having at least one diaphragm structure formed in the front side of the component is provided, according to which the MEMS component is mounted on a support which at least laterally delimits a cavity adjoining the diaphragm structure. In addition, at least one electrical feedthrough is formed in the support which allows electrical contacting of the MEMS component through the support. To achieve the largest possible rear volume for the diaphragm structure of the MEMS component for a given chip surface area, and also to simplify the processing of the support, according to the invention the electrical feedthroughs are integrated into the wall of the cavity adjoining the diaphragm structure, in that at least one section of such a feedthrough is implemented in the form of an electrically conductive coating of a side wall section of the cavity.

5 Claims, 4 Drawing Sheets

US 9,162,873 B2

COMPONENT AND METHOD FOR PRODUCING SAME

RELATED APPLICATION INFORMATION

The present application claims priority to and the benefit of German patent application no. 10 2012 220 323.0, which was filed in Germany on Nov. 8, 2012, the disclosure of which is incorporated herein by reference.

FIELD OF THE INVENTION

The present invention relates to the packaging of microelectromechanical system (MEMS) components having a diaphragm structure formed in the front side of the component. The component may be a pressure sensor, a speaker, or a microphone component, for example.

Such packaging is not only used for mechanical protection of the MEMS component, but also generally contributes significantly to the implementation and performance of the particular MEMS function. This is particularly apparent in the example of a microphone component. The sound opening of such a component is formed in the packaging of a MEMS microphone component, via which the front volume and a rear volume which is as large as possible are also implemented. The larger the rear volume, the better the signal-to-noise ratio (SNR), and thus also the performance of the microphone component. In addition, the packaging allows and determines the type of mechanical fixing and electrical contacting of the MEMS component within the scope of the second-level mounting, for example on a printed circuit board.

The starting point of the present invention is a component having a MEMS component in which at least one diaphragm structure is formed in the front side thereof, and having a support for this MEMS component. The support at least laterally delimits a cavity adjoining the diaphragm structure. In addition, the support is provided with at least one electrical feedthrough which allows electrical contacting of the MEMS component through the support.

A wafer level-based packaging concept for MEMS microphone components is discussed in Published Unexamined German Patent Application DE 10 2010 040 370 A1, in the front side of which a diaphragm structure is formed. According to one form of implementing this packaging concept, a cap wafer which is mounted on the front side of the MEMS component, above the diaphragm structure, is used as a support or interposer for the second-level mounting. In this case, the diaphragm structure is acted on by sound via an opening in the rear side of the component. The rear side volume for the microphone function is implemented in the form of a cavern which is formed in the front side of the cap wafer facing the microphone component, and which adjoins the diaphragm structure of the MEMS component. The electrical contacting of the MEMS component takes place via feedthroughs in the cap wafer which are situated at the side of this cavern and which establish a connection between terminal pads on the front side and on the rear side of the cap wafer. The terminal pads on the front side are used for electrically contacting the MEMS component, while the terminal pads on the rear side of the cap wafer are used for external contacting within the scope of the second-level mounting.

The package in Published Unexamined German Patent Application DE 10 2010 040 370 A1 is implemented in the form of a wafer stack, and may be mounted and electrically contacted using standard processes. One particular advantage of this packaging variant is that the micromechanical and circuit-related functionality of the microphone chips as well as the structure and electrical functionality of the cap wafer are applied and produced in the wafer composite, and in addition the connection of the microphone chip and the cap wafer in the wafer composite is established. Only then are the packages separated. This extensive parallelization of chip manufacture and packaging is extremely efficient, which affects the manufacturing method and the manufacturing costs. In addition, the component size may thus be reduced to a minimum, since the MEMS component and the cap wafer or interposer occupy the same chip surface area. Packages of this type require only a very small mounting surface, i.e., printed circuit board space, and have a very low installation height. This miniaturization with regard to surface area as well as height opens up numerous options for developing novel, improved end products having a diaphragm-based MEMS function.

These packaging concepts are believed to provide for forming the feedthroughs at the side of the cavern in the cap wafer or interposer. This configuration of the feedthroughs is at the expense of the lateral cavern extension for a given chip size. In addition, the processing of a cap wafer including a cavern which is closed on the rear side and completely or partially filled feedthroughs is relatively complicated.

SUMMARY OF THE INVENTION

Based on the known wafer-based packaging concept, measures are proposed by the present invention via which, for a given chip surface area, the largest possible rear volume for the diaphragm structure of the MEMS component may be achieved. In addition, the processing of the support is greatly simplified by these measures.

This is achieved according to the present invention in that the at least one electrical feedthrough in the support is integrated into the wall of the cavity adjoining the diaphragm structure. For this purpose, at least one section of the feedthrough is implemented in the form of an electrically conductive coating of a side wall section of the cavity.

Therefore, the chip or support surface area necessary for the feedthrough and the terminal pads for electrically contacting the MEMS component may be significantly reduced, in particular in favor of the cavity. For a component according to the present invention, the chip surface area necessary for electrically contacting the MEMS component is thus determined essentially only by the dimensions of the terminal pads.

The claimed manufacturing method is directed to a plate-shaped starting material for the supports. This may be a semiconductor wafer. However, some other support material may also be used, such as a printed circuit board material. In any case, via feedthroughs, in particular in the form of through openings which are coated with a conductive material or also completely filled, are initially produced in this support material for a plurality of MEMS components arranged in a grid-like manner.

These via feedthroughs are each electrically connected to at least one terminal pad for a MEMS component, and allow electrical contacting of the MEMS component through the support. The cavity openings for the MEMS components yet to be mounted are not produced in the front side of the support material until later, in a further structuring step. According to the present invention, the via feedthroughs which have already been produced are trimmed, so that in each case the remaining wall section of the trimmed via feedthroughs, which has already been coated with a conductive material, forms a section of the side wall of the cavity opening.

This procedure has proven to be advantageous in two respects. The through openings which are introduced into the support material for producing a via feedthrough may be relatively large, since ultimately only one electrically conductive coated wall section of this through opening remains as the feedthrough. The required processing complexity is much less than for the production of through openings having a very small opening area for so-called microvias. It is also advantageous that the positioning of the through openings for the via feedthroughs is relatively noncritical within the scope of the manufacturing method according to the present invention and is therefore uncomplicated, provided that the through openings are trimmed during the subsequent structuring of the support and are thus integrated into the wall of the resulting cavity. In any case, the cavity adjoining the diaphragm structure may be extended in this way, i.e., with a suitable configuration of the via feedthrough through openings, to the vicinity of the outer edge area of the MEMS component.

The layout requirements as well as the sequence of the method steps in the processing of the plate-shaped support material according to the present invention allow the use of mechanical structuring processes such as drilling, milling, or lasering. Although these processes are associated with relatively large manufacturing tolerances, they are particularly cost-effective and may be easily adapted to the properties of various support materials. The large manufacturing tolerances of mechanical structuring processes do not have an adverse effect within the scope of the packaging concept according to the present invention, since in this case the size of the through openings for the via feedthroughs as well as the size of the cavity openings are noncritical. The absence of a dependency of the material on mechanical structuring processes during production of the cavity openings has proven to be particularly advantageous. Namely, in this structuring step, in addition to the support material the conductive material of the via feedthroughs must be removed when these via feedthroughs are cut.

As the result of using mechanical structuring processes such as drilling and milling, the cavity openings have a circular opening area, i.e., an opening area which results from the partial overlap of multiple circular areas.

At this point, however, it is expressly pointed out that within the scope of the structuring of the support material according to the present invention, other processes such as etching processes may also be used, and that the through openings of the via feedthroughs as well as the cavity opening may correspondingly also have opening areas with other shapes.

In one specific embodiment of the packaging concept according to the present invention, the cavity adjoining the diaphragm structure of the MEMS component is implemented in the form of a through opening in the support. In applications which require a closed rear volume, such as microphone applications, the cavity may be easily closed with the aid of a base part which is either inserted into the through opening of the support or attached at the rear side of the support.

However, the cavity may also be implemented in the form of a blind hole-like recess in the front side of the support facing the MEMS component.

In the simplest case, the side wall section having the electrically conductive coating extends from the front side facing the MEMS component to the rear side of the support. Depending on the design of the support, however, the side wall section having the electrically conductive coating may also extend only from the front side facing the MEMS component to a wiring plane in the base area of the cavity which is electrically contactable starting from the rear side of the support.

As previously described in conjunction with the related art, it has proven advantageous with respect to the miniaturization of the component as well as to cost-effective manufacture when the support is implemented in the form of an interposer system having essentially the same chip surface area as the MEMS component. The individual component elements, the MEMS component and the support, may then each be produced in the wafer composite, and optionally also mounted in the wafer composite. When the components are not separated until this point, the support and the MEMS element of a component automatically have essentially the same chip surface area.

As explained above, there are various options for advantageously embodying and refining the teaching of the present invention. For this purpose, reference is made on the one hand to the patent claims subordinate to the independent patent claims, and on the other hand, to the following description of multiple exemplary embodiments of the present invention, with reference to the figures. Although the exemplary embodiments in each case relate to the packaging of a MEMS microphone component, the present invention is not limited to this specific application, and instead relates in a general manner to the packaging of MEMS components having a diaphragm structure.

DETAILED DESCRIPTION

As described above, the packaging concept according to the present invention for MEMS components, having a diaphragm structure formed in the front side of the component, is based on a specific configuration of a support for the MEMS component.

This support functions on the one hand as an interposer in the second-level mounting of the MEMS component. As such, the support is provided with at least one electrical feedthrough which establishes an electrical connection between the MEMS component on the front side of the support and further wiring planes within or on the rear side of the support.

On the other hand, the support at least laterally delimits a cavity adjoining the diaphragm structure of the MEMS component. In the microphone components described below, this cavity is used as the rear side volume.

Figure 1A:
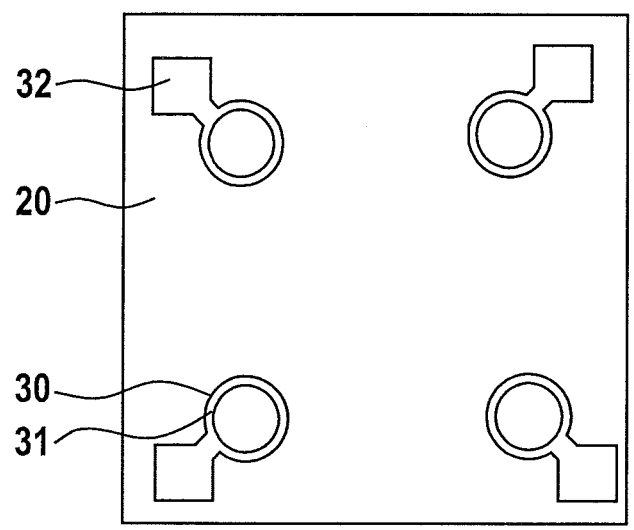
FIG. 1a shows a top view of the support of a first component according to the present invention after the production of four feedthroughs in the form of hollow vias having terminal pads.
Figure 1B:
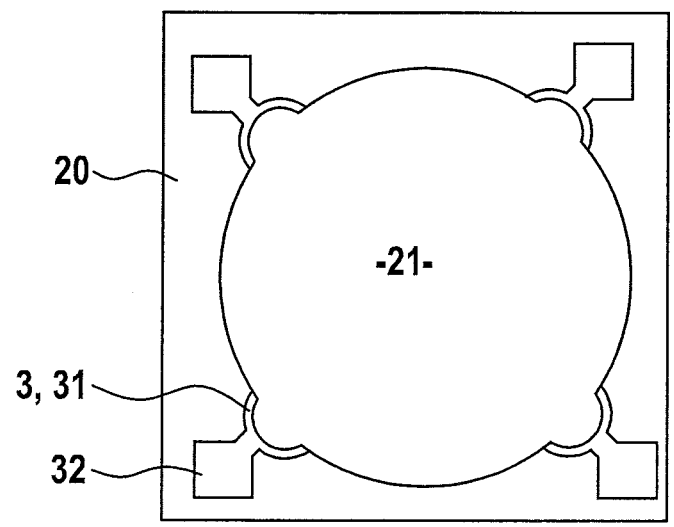
FIG. 1b shows a top view of this support after the production of a cavity opening.
Figure 1C:
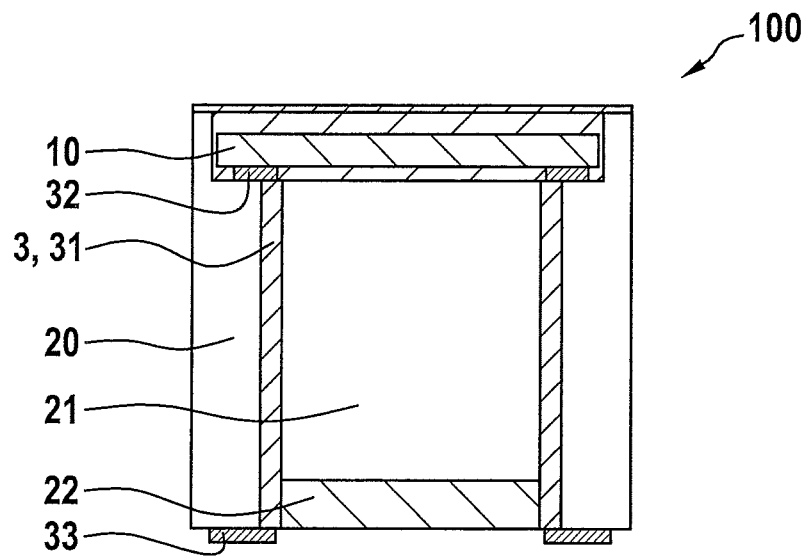
FIG. 1c shows a schematic sectional illustration of this component 100.

The component design based on the packaging concept according to the present invention is depicted with reference to the section of a microphone component 100 schematically illustrated in FIG. 1c.

Microphone component 100 includes a MEMS microphone component 10 having a diaphragm structure which is not illustrated in detail here. MEMS microphone component 10 is mounted on a support 20, so that the diaphragm structure spans a cavity 21 in support 20. In the exemplary embodiment illustrated here, microphone component 10 has been mounted face down on support 20. An electrical connection between MEMS microphone component 10 and support 20 has also been established, as will be explained in greater detail below. In principle, however, the MEMS component may also be mounted face up when the cavity in the support is coupled to the diaphragm structure via an opening in the rear side of the component. In this case, the electrical connection between the MEMS microphone component and the support is generally established with the aid of wire bonds.

In the present case, cavity 21 is implemented in the form of a through opening 21 in support 20 which is closed on the rear side with the aid of a base part 22. For this purpose, base part 22 has been inserted into through opening 21 or attached to the rear side of the support. The connection between microphone component 10 and support 20 is acoustically impermeable.

In the present case, MEMS microphone component 10 has been mounted on support 20, and an electrical connection to terminal pads 32 on the front side of support 20 has been established via a flip chip connection, for example stud bumping and conductive gluing, stud bumping and nonconductive gluing, Cu pillars and soldering, or solder ball or solder bump contacts. Alternatively, the MEMS component may be mounted on the support in such a way that the terminal pads of the MEMS component are oriented facing away from the terminal pads of the support. The electrical contacting support for the MEMS then takes place via wire bonds. This requires that the MEMS component does not cover the pad contacts of the support. These terminal pads 32 are connected to feedthroughs 3 in support 20, so that MEMS microphone component 10 is electrically contactable via terminal pads 33 on the rear side of support 20. Feedthroughs 3 are implemented in the form of an electrically conductive coating 31, for example a metal plating, on a wall section of cavity 21, and are integrated into the wall of cavity 21 in this way.

For this purpose, feedthroughs in the form of hollow vias 30, i.e., in the form of through openings in support material 20, are initially produced in a plate-shaped support material 20 and provided with an electrically conductive coating 31. In the exemplary embodiment illustrated here, electrically conductive coating 31 is an edge metal plating. In addition, terminal pads 32, 33 for these hollow vias are formed on the front side and on the rear side of support 20, for example by suitable structuring of a printed conductor metal plating. The result of this processing is illustrated in FIG. 1a, which shows a top view of support 20 of microphone component 100. Terminal pads 32 of the four feedthroughs 3 are situated as far to the outside as possible, in the four corners of the square support surface area. At the side thereof, hollow vias 30 having a circular cross-sectional surface are formed in each case on the surface area diagonals. The middle area of support 20 above which the diaphragm structure of the MEMS microphone component is to be situated is still closed here.

Through opening 21, which determines the lateral extension of the rear side volume, is not produced in support 20 until a further structuring step, the result of which is illustrated in FIG. 1b. Through opening 21 is a centrally situated borehole, in the broadest sense, whose diameter is selected to be large enough that not only has support material been removed from the middle area of support 20, but also in each case approximately one-half of hollow vias 30 formed in the edge area of support 20 have been removed. Accordingly, the cross-sectional surface of through opening 21 is circular and has four semicircular salients which are due to the original circular cross-sectional surface areas of hollow vias 30. Therefore, the wall of through opening 21 in the area of these salients is coated with edge metal plating 31 of hollow vias 30. These wall sections 31 of through opening 21 are electrically separated from one another by uncoated wall sections. Metal-plated wall sections 31 remaining in each case from original hollow vias 30 function as feedthroughs 3, and, the same as original hollow vias 30, in each case connect a terminal pad 32 on the front side of support 20 to a terminal pad on the rear side of the support. FIG. 1b shows that through opening 21 may be extended by opening and cutting hollow vias 30 up to the edge area of support 20.

Figure 2A:
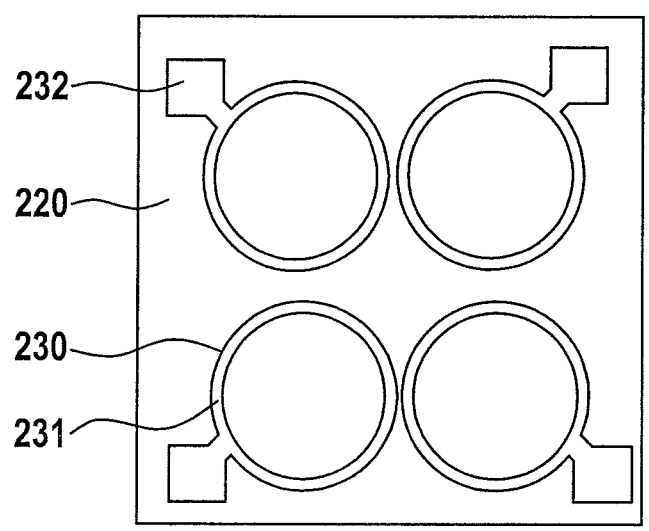
FIG. 2a shows a top view of the support of a second component according to the present invention after the production of four feedthroughs in the form of hollow vias having terminal pads.
Figure 2B:
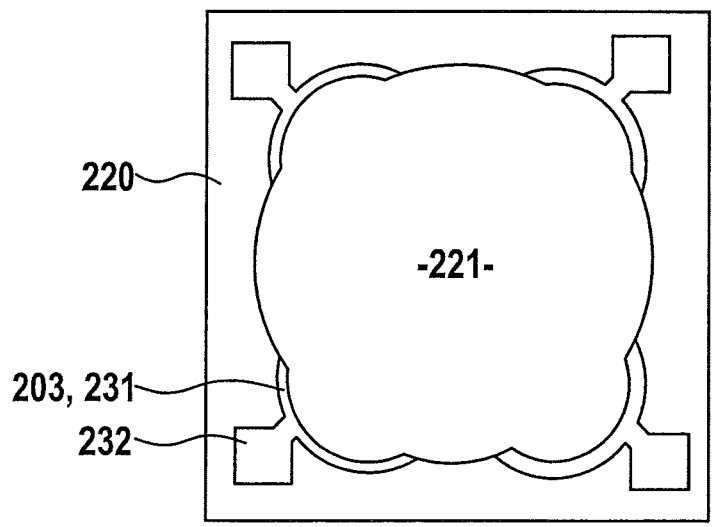
FIG. 2b shows a top view of this support after the production of the cavity opening.

Also in the case of support 220 of a further microphone component illustrated in FIGS. 2a and 2b, four hollow vias 230 having terminal pads 232 on the front side of support 220 and on the rear side of the support have been initially produced, in particular likewise according to the via-next-to-pad approach. As illustrated in FIG. 2a, hollow vias 230 have a relatively large circular opening area. FIG. 2b shows that the lateral extension of original hollow vias 230 is insignificant after through opening 221 is produced, provided that a portion of edge metal plating 231 still remains and the function of a feedthrough 203 may be met.

At this point it is also noted that the metal-plated wall sections of the through opening in the support of a component according to the present invention contribute to good heat dissipation. In the case of a microphone component, this may have a positive effect on the microphone performance. In addition, leakage currents may be reduced, since a major portion of the metal-plated areas is separated by air and not by plastic.

Figure 3A:
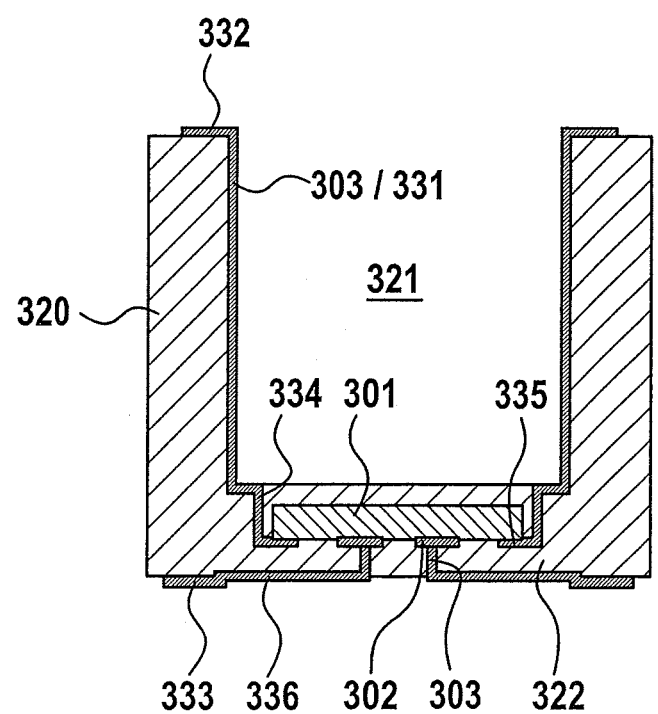
FIGS. 3a, 3b, and 3c show schematic sectional illustrations of three supports configured according to the present invention, having feedthroughs which in each case are guided on a wiring plane in the base area of the cavity.
Figure 3B:
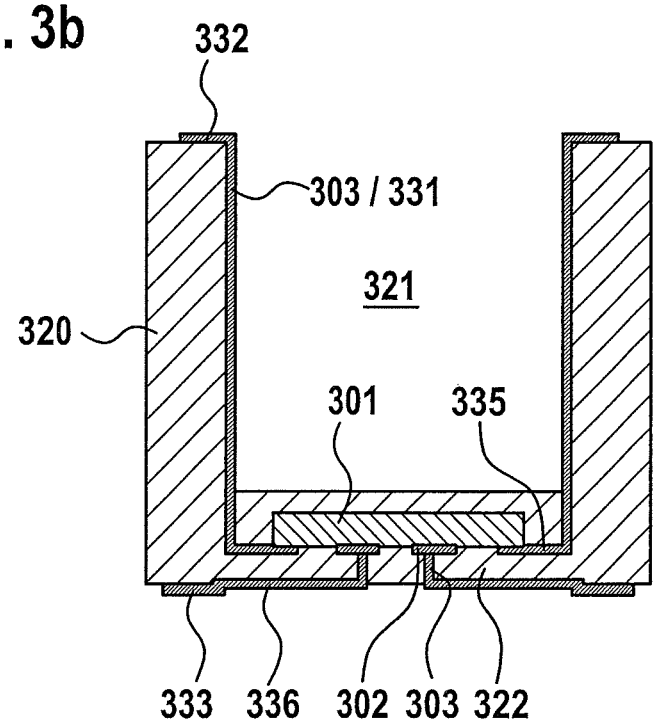
Figure 3C:
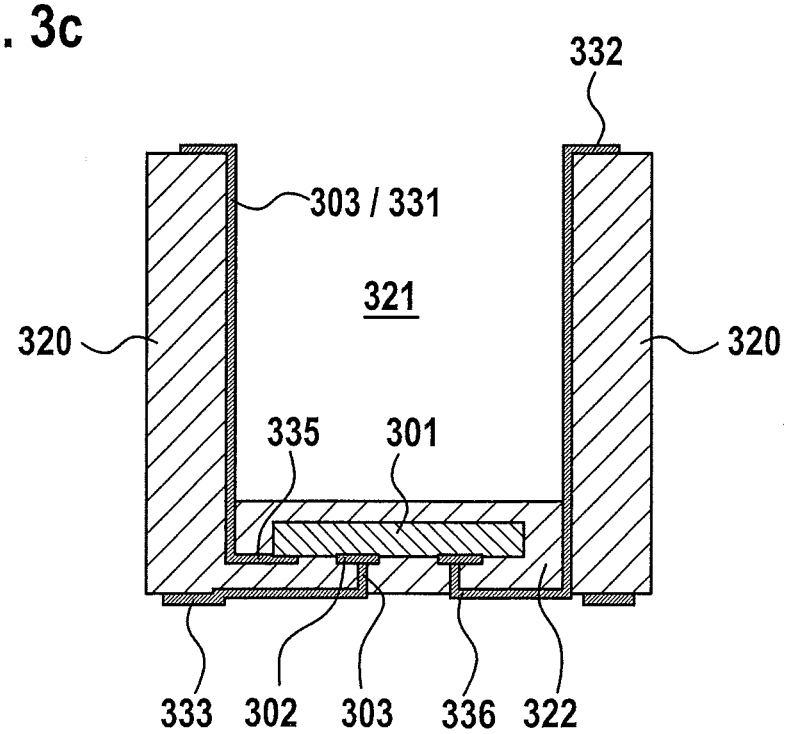

FIGS. 3a through 3c show that the feedthroughs in the support which are implemented according to the present invention do not necessarily have to extend from the front side of the support to the rear side of the support. In all three embodiment variants of a support 320 illustrated here, the intent is to establish, with the aid of side wall metal platings 331 of cavity 321, an electrical connection between a MEMS component above cavity 321, i.e., on support 320, and a chip 301 which is fitted into base area 322 beneath cavity 321. This chip 301 is electrically contactable in each case via terminal pads 302 of a rewiring plane 335 and vias 303 in base 322, starting from the rear side of the support. For this purpose, printed conductors 335 and terminal pads 333 are formed on the rear side of the support.

In support 320 illustrated in FIG. 3a, side wall metal plating 331 extends only to base 322 of cavity 321, where it is guided, via vias 334, on rewiring plane 335 in base 322, to which chip 301 is also connected.

In the case of support 320 illustrated in FIG. 3b, side wall metal plating 331 extends to rewiring plane 335 in base 322. In the case of support 320 illustrated in FIG. 3c, side wall metal plating 331 extends at least on one side of cavity 321 through base 322 to the rear side of the support, where it is connected to rewiring plane 335 and chip 301 via a printed conductor 335 and vias 303 on the rear side.

What is claimed is:

1. A component, comprising:
a MEMS component having at least one diaphragm structure formed in the front side of the component; and
a support for the MEMS component;
wherein the support at least laterally delimits a cavity adjoining the diaphragm structure,
wherein the support includes at least one electrical feedthrough which allows electrical contacting of the MEMS component through the support,
wherein the electrical feedthrough is integrated into the wall of the cavity adjoining the diaphragm structure, in that at least one section of the feedthrough includes an electrically conductive coating of a side wall section of the cavity, and
wherein the side wall section having the electrically conductive coating extends from a front side surface facing the MEMS component to a rear side surface of the support.

2. The component of claim 1, wherein the cavity adjoining the diaphragm structure of the MEMS component includes a through opening in the support which is closed off on the rear side opposite from the MEMS component by a base part.

3. The component of claim 1, wherein the cavity adjoining the diaphragm structure of the MEMS component includes a blind hole-like recess in the front side of the support facing the MEMS component.

4. The component of claim 1, wherein the support includes an interposer system having essentially the same chip surface area as the MEMS component.

5. The microphone component of claim 1, further comprising:
a MEMS microphone component in which the cavity in the support adjoining the diaphragm structure functions as the rear volume.

* * * * *